US012453009B2

(12) United States Patent
Oh

(10) Patent No.: US 12,453,009 B2
(45) Date of Patent: Oct. 21, 2025

(54) PRINTED CIRCUIT BOARD AND SEMICONDUCTOR PACKAGE USING THE SAME

(71) Applicant: SAMSUNG ELECTRONICS CO., LTD., Suwon-si (KR)

(72) Inventor: Jooyoung Oh, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 781 days.

(21) Appl. No.: 17/692,831

(22) Filed: Mar. 11, 2022

(65) Prior Publication Data
US 2023/0027559 A1 Jan. 26, 2023

(30) Foreign Application Priority Data
Jul. 23, 2021 (KR) .................. 10-2021-0096906

(51) Int. Cl.
*H05K 1/11* (2006.01)
*H01L 23/00* (2006.01)
*H01L 23/498* (2006.01)

(52) U.S. Cl.
CPC ........ *H05K 1/113* (2013.01); *H01L 23/49816* (2013.01); *H01L 23/49822* (2013.01); *H01L 23/49838* (2013.01); *H01L 24/10* (2013.01); *H01L 24/32* (2013.01); *H01L 24/48* (2013.01); *H01L 24/73* (2013.01);
(Continued)

(58) Field of Classification Search
CPC .......... H05K 1/113; H05K 1/09; H05K 1/111; H05K 3/3457; H01L 23/49816; H01L 23/49822; H01L 2224/05564; H01L 2224/05569; H01L 23/49838; H01L 23/5226; H01L 24/04; H01L 24/10;
(Continued)

(56) References Cited

U.S. PATENT DOCUMENTS 7,795,743 B2  9/2010  Kim et al.
8,461,036 B2  6/2013  Wu et al.
(Continued)

FOREIGN PATENT DOCUMENTS

KR  10-0640657 B1  11/2006

*Primary Examiner* — Fazli Erdem
(74) *Attorney, Agent, or Firm* — Sughrue Mion, PLLC

(57) ABSTRACT

Provided is a printed circuit board including a substrate structure having a first surface including a chip mounting region on which a semiconductor chip is mounted and a second surface opposite to the first surface, the second surface having a rectangular shape having a first edge, a second edge, a third edge, and a fourth edge and a first corner, a second corner, a third corner, and a fourth corner formed by the first to fourth edges, and pad patterns disposed on the second surface of the substrate structure, wherein the second surface includes a first region including a region corresponding to the chip mounting region and in contact with the first to fourth edges of the second surface, respectively, and second regions adjacent to the first to fourth corners of the second surface, respectively and spaced apart from each other by the first region, wherein the pad patterns include first pad patterns disposed in the first region and surface-treated with a nickel/gold (Ni/Au) layer, and second pad patterns disposed in the second regions and surface-treated with an organic solderability preservative.

20 Claims, 9 Drawing Sheets

(52) U.S. Cl.
CPC ............ *H01L 2224/05564* (2013.01); *H01L 2224/05569* (2013.01); *H01L 2224/32225* (2013.01); *H01L 2224/48228* (2013.01); *H01L 2224/73265* (2013.01); *H05K 2201/032* (2013.01)

(58) Field of Classification Search
CPC ......... H01L 24/16; H01L 24/32; H01L 24/48; H01L 24/73
USPC ....................................................... 257/777
See application file for complete search history.

(56) References Cited

U.S. PATENT DOCUMENTS

| | | |
|---|---|---|
| 8,970,026 B2 | 3/2015 | Leal et al. |
| 9,603,247 B2 | 3/2017 | Swaminathan et al. |
| 9,704,735 B2 | 7/2017 | Konchady et al. |
| 10,325,876 B2 | 6/2019 | Mathew et al. |
| 2007/0020565 A1 | 1/2007 | Koh et al. |
| 2012/0077054 A1 | 3/2012 | Wu et al. |
| 2017/0148699 A1* | 5/2017 | Seo .................... H01L 23/5389 |
| 2019/0164920 A1 | 5/2019 | Tsao et al. |
| 2021/0118785 A1 | 4/2021 | Lin |

* cited by examiner

PRINTED CIRCUIT BOARD AND SEMICONDUCTOR PACKAGE USING THE SAME

CROSS-REFERENCE TO RELATED APPLICATION

This application claims priority to Korean Patent Application No. 10-2021-0096906 filed on Jul. 23, 2021 in the Korean Intellectual Property Office, the disclosure of which is incorporated herein by reference in its entirety.

BACKGROUND

Example embodiments of the present disclosure relate to a printed circuit board and a semiconductor package using the same.

A semiconductor package is mounted on a substrate (e.g., a main board, or the like) through connection bumps such as solder balls. Reliability of the semiconductor package is affected by a connection state between the connection bump and the semiconductor package. In order to guarantee the reliability of the semiconductor package, a technology capable of preventing cracks occurring in pad patterns, connection bumps, and the like is required.

SUMMARY

One or more example embodiments provide a printed circuit board having improved electrical characteristics and reliability, and a semiconductor package using the same.

According to an aspect of an example embodiment, there is provided a printed circuit board including a substrate structure having a first surface including a chip mounting region on which a semiconductor chip is mounted and a second surface opposite to the first surface, the second surface having a rectangular shape having a first edge, a second edge, a third edge, and a fourth edge and a first corner, a second corner, a third corner, and a fourth corner formed by the first to fourth edges, and pad patterns disposed on the second surface of the substrate structure, wherein the second surface includes a first region including a region corresponding to the chip mounting region and in contact with the first to fourth edges of the second surface, respectively, and second regions adjacent to the first to fourth corners of the second surface, respectively and spaced apart from each other by the first region, wherein the pad patterns include first pad patterns disposed in the first region and surface-treated with a nickel/gold (Ni/Au) layer, and second pad patterns disposed in the second regions and surface-treated with an organic solderability preservative (OSP).

According to another aspect of an example embodiment, there is provided a printed circuit board including a substrate structure having a first surface including a chip mounting region on which a semiconductor chip is mounted, and a second surface opposite to the first surface, and pad patterns disposed on the second surface of the substrate structure, wherein the second surface includes a first region including a region corresponding to the chip mounting region and in contact with respective edges of the second surface, and second regions adjacent to respective corners of the second surface and spaced apart from each other, wherein the pad patterns include first pad patterns surface-treated with a metal layer and second pad patterns surface-treated with an oxidation prevention layer, wherein the first pad patterns are disposed in the first region, and the second pad patterns are disposed in the second regions, respectively.

According to another aspect of an example embodiment, there is provided a semiconductor package including a semiconductor chip, a substrate structure having a first surface including a chip mounting region on which the semiconductor chip is mounted and a second surface, opposite to the first surface, the second surface having a rectangular shape having a first edge, a second edge, a third edge, and a fourth edge, and a first corner, a second corner, a third corner, and a fourth corner formed by the first to fourth edges, pad patterns disposed on the second surface of the substrate structure, and connection bumps respectively connected to the pad patterns, wherein the pad patterns include first pad patterns disposed in a first region respectively adjacent to the first to fourth edges and including a region corresponding to the chip mounting region, in direct contact with the connection bumps, and the first pad patterns including a first metal material, and second pad patterns disposed in second regions respectively adjacent to the first to fourth corners, the second regions being regions other than the first region, the second pad patterns including the first metal material and having a metal layer including a second metal material disposed on an interface in contact with the connection bumps.

BRIEF DESCRIPTION OF DRAWINGS

The above and/or other aspects, features, and advantages of example embodiments will be more clearly understood from the following detailed description, taken in conjunction with the accompanying drawings, in which.

DETAILED DESCRIPTION

Hereinafter, example embodiments will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
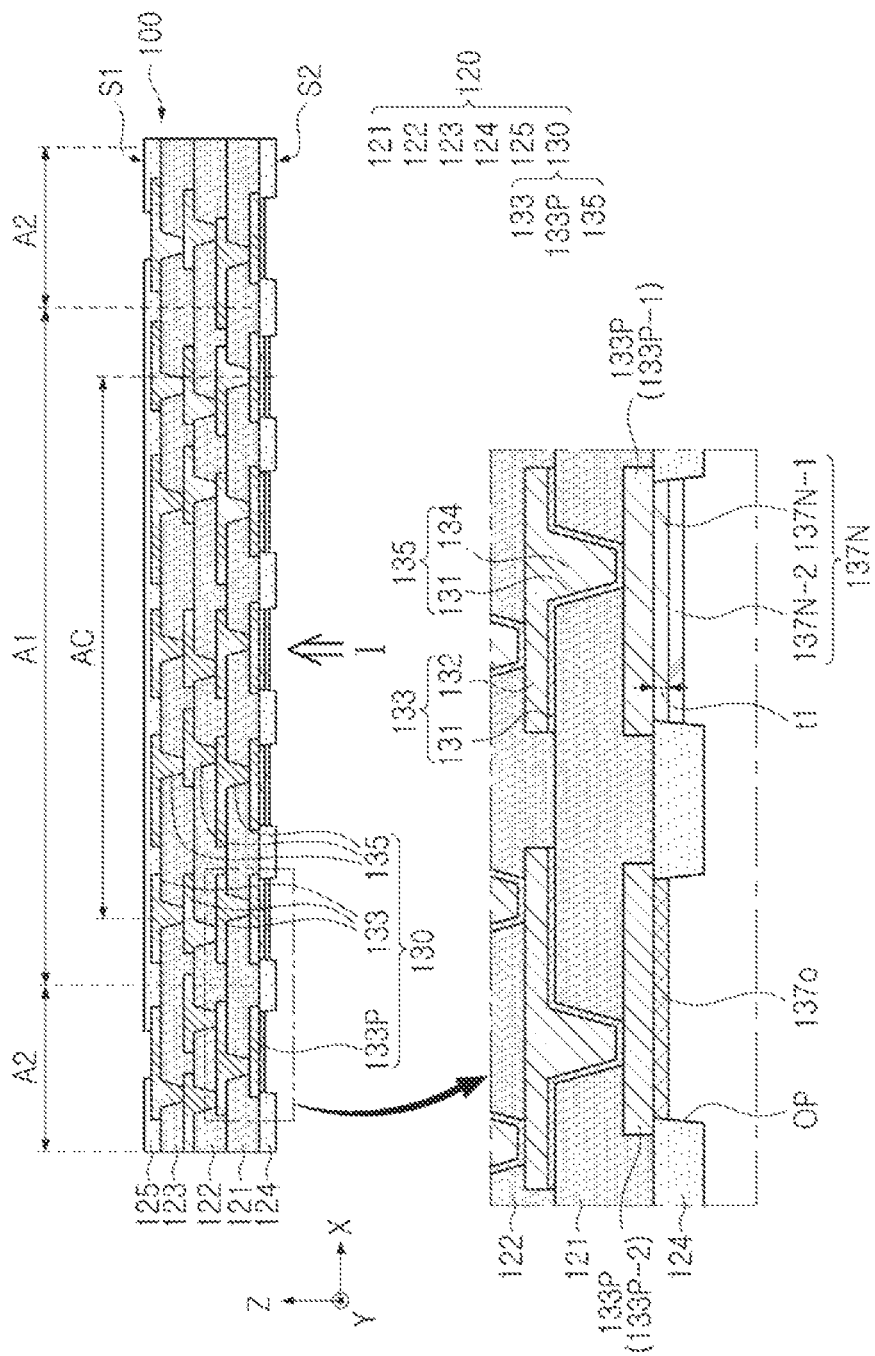
FIG. 1 is a cross-sectional view illustrating a printed circuit board according to an example embodiment.

A printed circuit board according to an example embodiment will be described with reference to FIGS. 1 and 2. FIG. 1 is a cross-sectional view illustrating a printed circuit board according to an example embodiment, and FIG. 2 is a plan view viewed in a direction I of FIG. 1.

Figure 2:
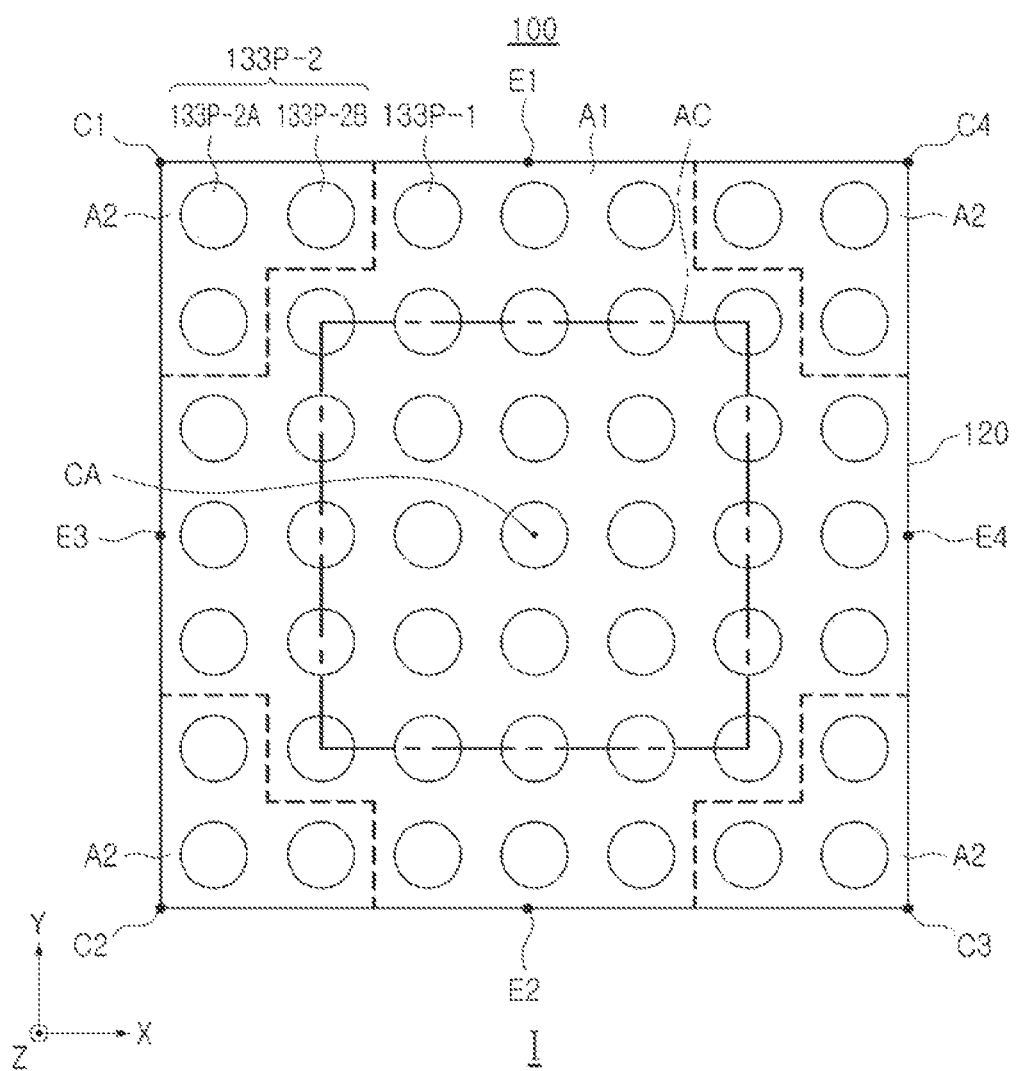
FIG. 2 is a plan view viewed from the direction I of FIG. 1.

Referring to FIGS. 1 and 2, a printed circuit board 100 may include a substrate structure 120 on which pad patterns 133P are disposed. The substrate structure 120 may include insulating layers 121, 122, and 123, passivation layers 124 and 125, and a wiring structure 130. In an example embodiment, the substrate structure 120 being formed of a multi-layer structure including the insulating layers 121, 122, and 123 will be described as an example. However, embodiments are not limited thereto, and the substrate structure 120 may be formed of a single-layer structure. The wiring structure 130 may include wiring patterns 133, connection vias 135, and pad patterns 133P. The printed circuit board 100 may be a support substrate for manufacturing a semiconductor package by mounting a semiconductor chip. The substrate structure 120 may have a first surface S1 and a second surface S2 positioned on opposite surfaces. In an example embodiment, the first surface S1 and the second surface S2 may have a rectangular shape. A chip mounting region AC in which a semiconductor chip is mounted may be disposed on the first surface S1. Pad patterns 133P may be disposed on the second surface S2.

The insulating layers 121, 122, and 123 may include a plurality of insulating layers 121, 122, and 123 stacked in a vertical direction Z, for example, a first insulating layer 121, a second insulating layer 122, and a third insulating layer 123. The insulating layers 121, 122, and 123 may cover wiring patterns 133 and connection vias 135. The insulating layers 121, 122, and 123 may include an insulating resin. The insulating resin may include a thermosetting resin such as an epoxy resin, a thermoplastic resin such as polyimide, or a resin impregnated with inorganic fillers or/and glass fibers (glass fiber, glass cloth, glass fabric) in these resins, for example, prepreg, Ajinomoto Build-up Film (ABF), FR-4, and bismaleimide triazine (BT). In addition, the insulating layers 121, 122, and 123 may include a photosensitive resin such as photoimageable dielectric (PID) resin. In this example, the insulating layers 121, 122, and 123 may be formed to be thinner than when PID resin is not included, and fine wiring patterns 133 and connection vias 135 may be formed. A boundary between the insulating layers 121, 122, and 123 of different levels may be unclear and may be integrated depending on the process.

The passivation layers 124 and 125 may be provided as layers for protecting the semiconductor package from external physical and chemical damage. The passivation layers 124 and 125 may protect the substrate structure 120. The first passivation layer 124 may be disposed in a lower region of the substrate structure 120, for example, to cover a lower surface of the first insulating layer 121. The second passivation layer 125 may be disposed in an upper region of the substrate structure 120, for example, to cover an upper surface of the third insulating layer 123. The passivation layers 124 and 125 may include, for example, an insulating resin and an inorganic filler, but may not include glass fiber. For example, the passivation layers 124 and 125 may include ABF, but embodiments are not limited thereto, and may include a photosensitive insulating material (PID) or an insulating polymer, for example, photosensitive polyimide (PSPI). Each of the passivation layers 124 and 125 may have openings OP for exposing a lower surface of the substrate structure 120 and an upper surface thereof. The openings OP of the first passivation layer may open the second surface S2 of the substrate structure 120, and one region of the pad patterns 133P may be exposed through the openings OP, respectively. Connection bumps such as solder balls may be connected to the one region of the pad patterns 133P exposed through the openings OP, respectively. The printed circuit board 100 according to an example embodiment may be provided in a state in which connection bumps are not connected to the pad patterns 133.

The pad patterns 133P may be disposed to be adjacent to the second surface S2 of the substrate structure 120. The pad patterns 133P may include a metal material, for example, copper (Cu), aluminum (Al), silver (Ag), tin (Sn), gold (Au), nickel (Ni), lead (Pb), or titanium (Ti), or alloys thereof. According to an example embodiment, the pad patterns 133P including copper will be described as an example.

Referring to FIGS. 1 and 2, the pad patterns 133P may include first pad patterns 133P-1 and second pad patterns 133P-2. The first pad patterns 133P-1 may be disposed in the first region A1 of the second surface S2, and the second pad patterns 133P-2 may be disposed on the second regions A2 of the second surface S2, respectively. The pad patterns 133P may be disposed in a matrix form forming rows and columns on the second surface S2 of the substrate structure 120. A width and distance of the pad patterns 133P may be uniformly disposed, but embodiments are not limited thereto, and the width and distance of the pad patterns 133P may not be uniform according to example embodiments. In addition, an example embodiment is described with reference to an example in which the pad patterns 133P are disposed in a 7×7 grid, but embodiments are not limited thereto, and the number and disposition of the pad patterns 133P may be variously modified.

Referring to FIG. 2, the first region A1 and the second regions A2 may be disposed not to overlap each other on the second surface S2 of the substrate structure 120.

The first region A1 may be disposed adjacent to at least one of the first edge E1, the second edge E2, the third edge E3, and the fourth edge E4 of the second surface S2, and include a region corresponding to the chip mounting region AC of the first surface S1. For example, the first region A1 may be disposed to be adjacent to all of the first to fourth edges E1 to E4 while including the region corresponding to the chip mounting region AC. First pad patterns 133P-1 described above may be disposed in the first region A1.

The second regions A2 are regions other than the first region A1, and may be disposed adjacent to the first corner C1, the second corner C2, the third corner C3, and the fourth corner C4 of the substrate structure 120, respectively. The second regions A2 may be spaced apart from each other by the first region A1. The second regions A2 may include a region extending along the first to fourth edges E1 to E4 while being spaced apart from each other. The second regions A2 may have substantially the same shape, and substantially the same area to each other. Accordingly, the same number of second pad patterns may be disposed in each of the second regions A2. According to an example embodiment, the second regions A2 may have a mirror-symmetrical shape to each other. The second regions A2 may be rotationally symmetrical every 90° with respect to a center CA of the second surface S2. A shape of the second regions A2 may be a quadrangle, a triangle, an L-shape, an I-shape, or a combination thereof. According to an example embodiment, an example in which the second regions A2 are L-shaped will be described as an example.

A second pad pattern 133P-2A disposed adjacent to the first to fourth corners C1 to C4 of the pad patterns 133P, respectively, may be disposed in the second regions A2. In addition, at least one second pad pattern 133P-2B may be further included in the second regions A2 in addition to the second pad pattern 133P-2A most adjacent to the first to fourth corners C1 to C4, respectively.

The disposition of the second regions A2 may be variously modified. FIGS. 4A to 4D are modified examples of the pad pattern of FIG. 2.

Figure 4A:
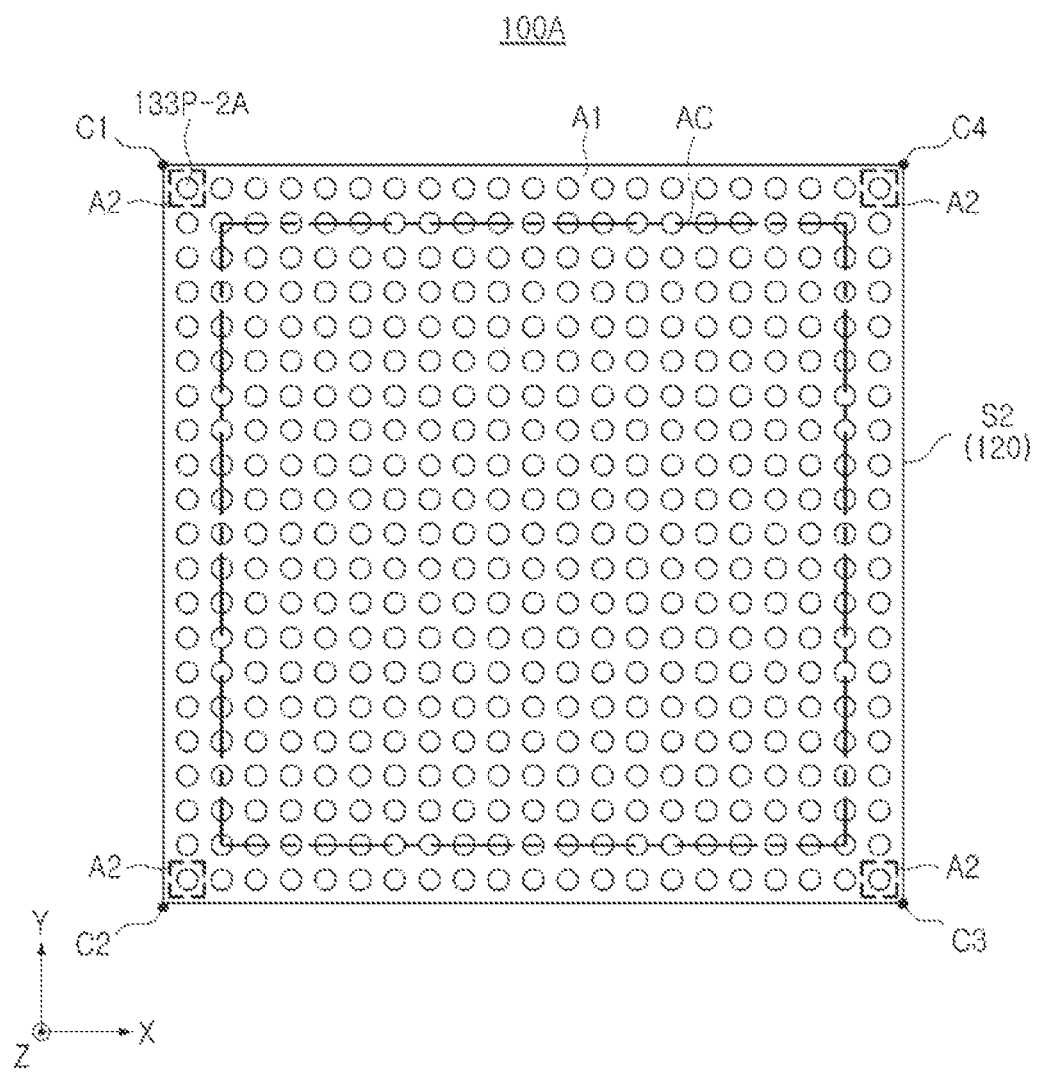
FIGS. 4A, 4B, 4C, and 4D are modified examples of the pad pattern of FIG. 2.

FIG. 4A is an example in which second regions A2 are minimally disposed on a second surface S2 of a substrate structure 120 included in a printed circuit board 100A with a minimal area. Each of the second regions A2 may be disposed only one second pad pattern 133P-2A adjacent to the first to fourth corners C1 to C4 of the second surface S2 of the substrate structure 120. Accordingly, an area of the first region A1 may be maximized.

Figure 4B:
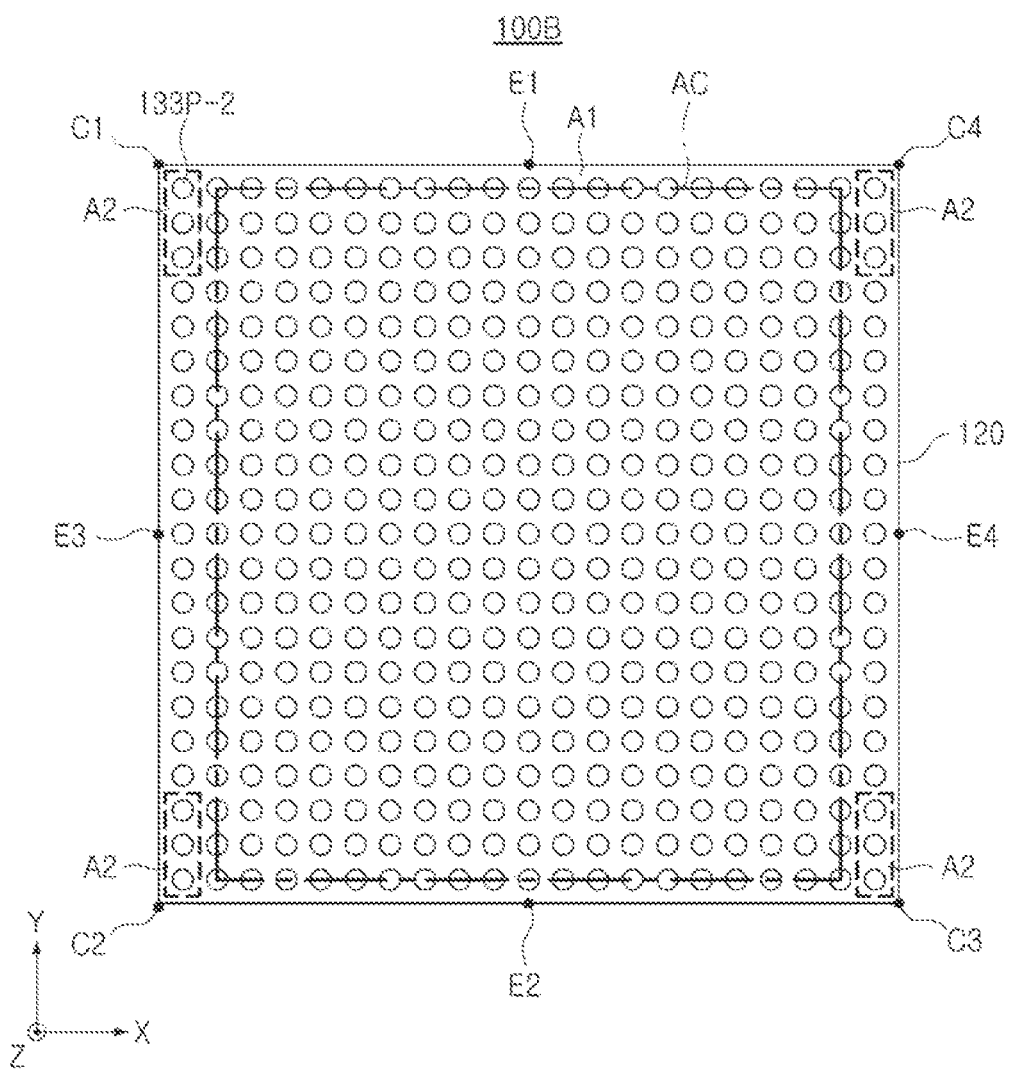

FIG. 4B is an example in which second regions A2 are disposed in an I-shape on a second surface S2 of a substrate structure 120 included in a printed circuit board 100B. The second regions A2 may be disposed to extend along the third edge E3 and the fourth edge E4, while adjacent to the first to fourth corners C1 to C4 of the second surface S2 of the substrate structure 120, respectively. The second pad patterns 133P-2 may be disposed in rows or columns in the second regions A2.

Figure 4C:
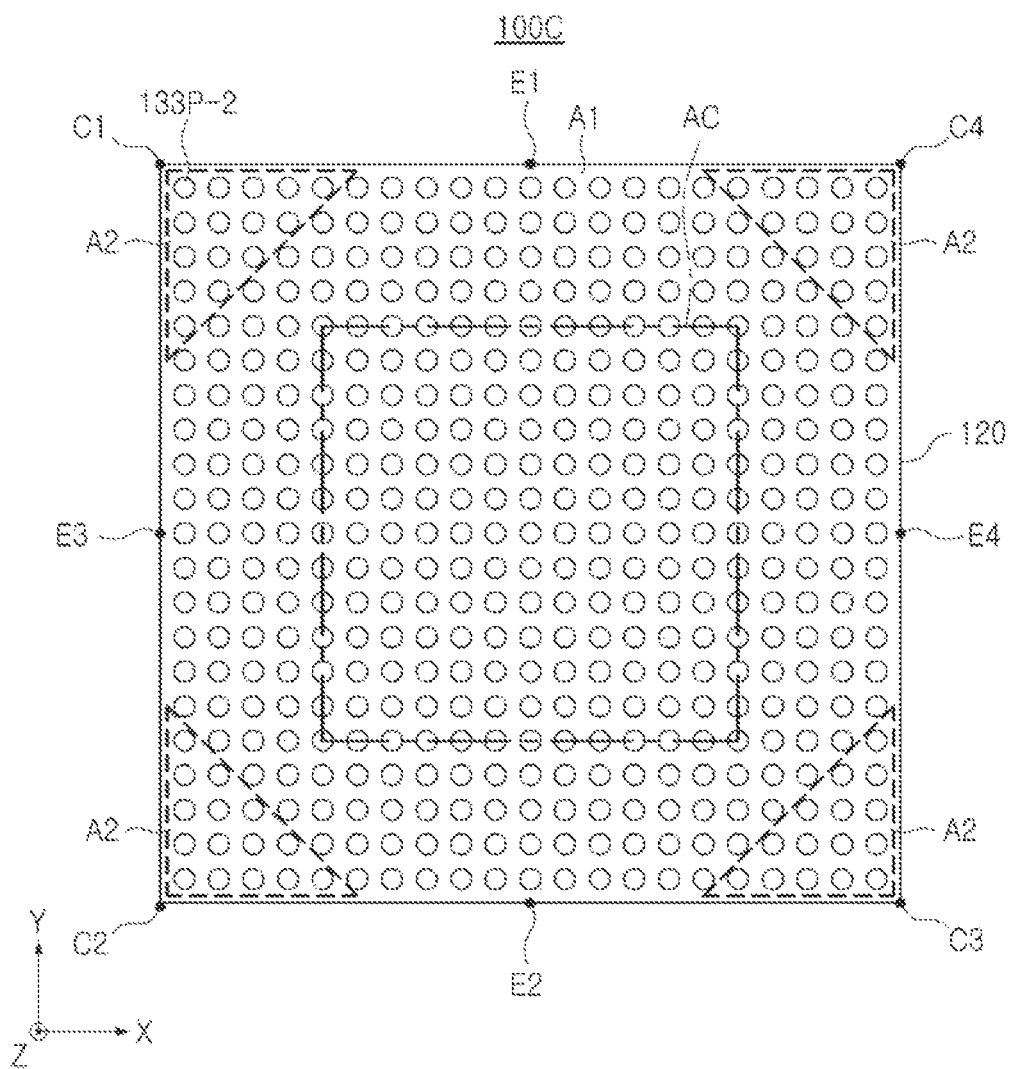

FIG. 4C is an example in which second regions A2 are disposed in a triangular shape on a second surface S2 of a substrate structure 120 included in a printed circuit board 100C. Each of the second regions A2 may be disposed in a triangular shape extending along the first to fourth edges E1 to E4, while adjacent to the first to fourth corners C1 to C4 of the second surface S2 of the substrate structure 120, respectively. The second pad patterns 133P-2 may be disposed in rows and columns in the second regions A2.

Figure 4D:
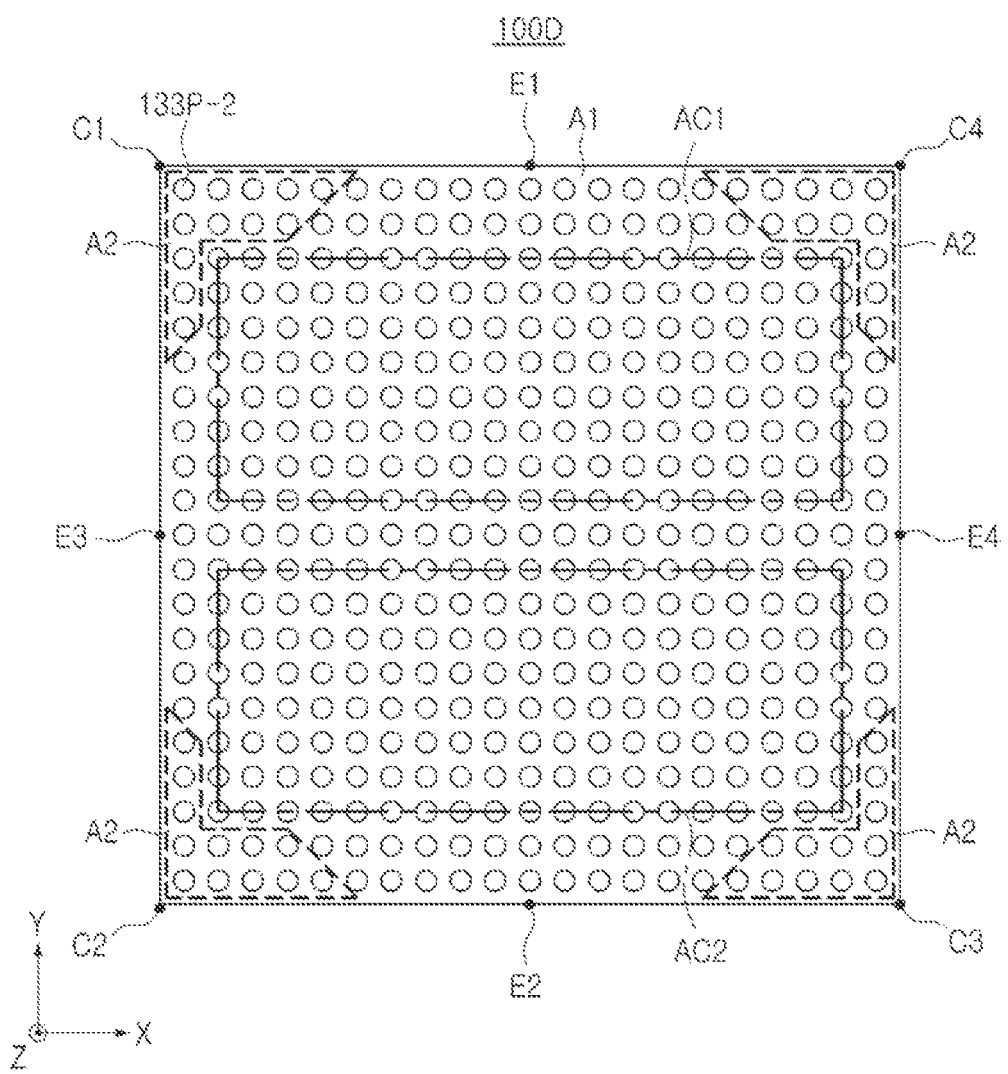

FIG. 4D shows an example in which second regions A2 have an overall triangular shape on a second surface S2 of a substrate structure 120 included in a printed circuit board 100D, and have a cut-out portion that does not overlap with the first chip mounting region AC1 and the second chip mounting region AC2. The second pad patterns 133P-2 may be disposed in rows and columns in the second regions A2.

Referring back to FIG. 1, the surfaces of the first pad patterns 133P-1 may be surface-treated with a metal layer 137N, respectively. The metal layer 137N may improve thermal cycle (TC) reliability among board level reliability (BLR). As the pad pattern 133P is miniaturized, a thickness thereof may be reduced so that the pad pattern 133P may be vulnerable to pattern cracks. For example, occurrence of the pattern cracks may cause the thermal cycle (TC) reliability to be greatly reduced among the board level reliability (BLR). Here, the TC reliability is a test for checking whether the reliability is maintained up to a predetermined number of times by periodically increasing and lowering the temperature at a board level. In an example embodiment, since the metal layer 137N is formed by performing an additional surface treatment process on the first pad patterns 133P-1, the cracks may be prevented from occurring in the first pad patterns 133P-1. Accordingly, the TC reliability may be improved to improve a lifespan, and the electrical characteristics and reliability of the semiconductor package may be improved.

In an example embodiment, the metal layer 137N may be a nickel/gold (Ni/Au) layer. The metal layer 137N may be formed to be in contact with a side surface of the openings OP and to cover the first pad patterns 133P-1. The metal layer 137N may have a multilayer structure in which a nickel layer 137N-1 and a gold layer 137N-2 are sequentially stacked. The nickel layer 137N-1 may be disposed in direct contact with the first pad patterns 133P-1, and the gold layer 137N-2 may be disposed to cover the nickel layer 137N-1. Accordingly, the gold layer 137N-2 may be exposed on a bottom surface of the openings OP. The gold layer 137N-2 may disappear in a process of attaching connection bumps to the first pad patterns 133P-1, but the nickel layer 137N-1 may remain between the first pad patterns 133P-1 and the connection bumps. Accordingly, compared to an example in which the metal layer 137N is not formed on the first pad patterns 133P-1, the nickel layer 137N-1 may be thicker by a thickness t1.

Figure 3A:
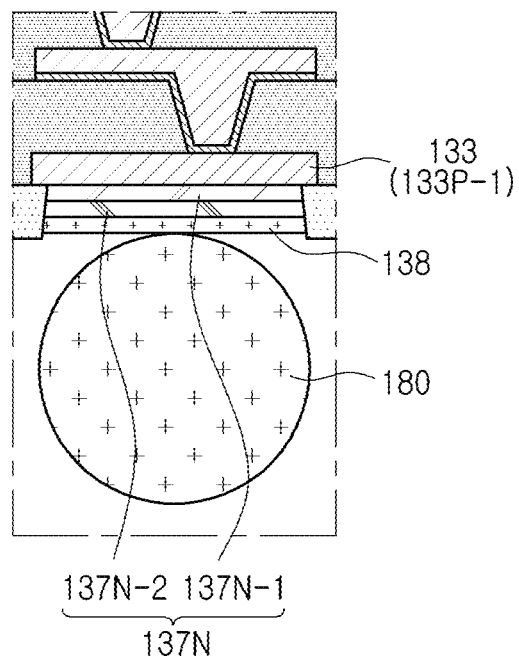
FIGS. 3A and 3B are diagrams illustrating attachment of a solder ball to a pad pattern of a printed circuit board according to an example embodiment.
Figure 3A:
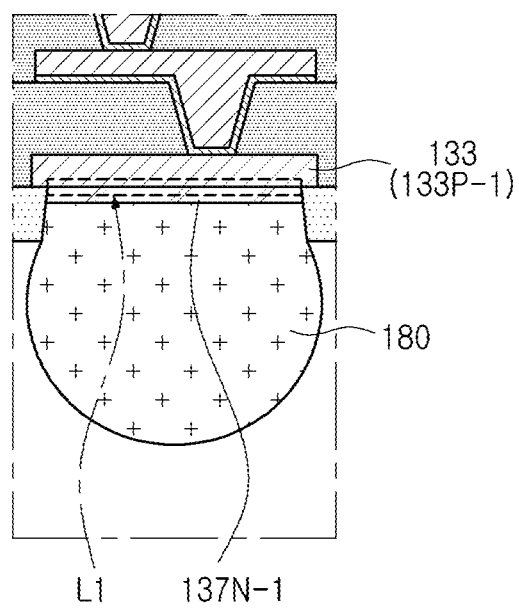

Referring to FIG. 3A, before connecting the connection bumps 180 to the first pad patterns 133P-1, solder 138 is applied on the metal layer 137N and the connection bumps 180 such as solder balls are attached thereto. When the connection bumps 180 are attached, the gold layer 137N-2 of the nickel/gold layer 137N diffuses into the connection bumps 180, and facilitates fusion between the first pad patterns 133P-1 and the connection bumps 180. Accordingly, a metal bonding layer L1 made of an alloy of nickel and tin may be formed at an interface between the first pad patterns 133P-1 and the connection bumps. The metal bonding layer L1 made of an alloy of nickel and tin has high TC reliability, but has a weakness that BLR drop reliability is relatively low, which is a test against impact or bending applied from the outside.

Surfaces of each of the second pad patterns 133P-2 may be surface-treated with an organic solderability preservative (OSP) 137o. The OSP is an organic solvent having high adhesion to a surface of copper, and may prevent the surfaces of the second pad patterns 133P-2 from being oxidized.

Figure 3B:
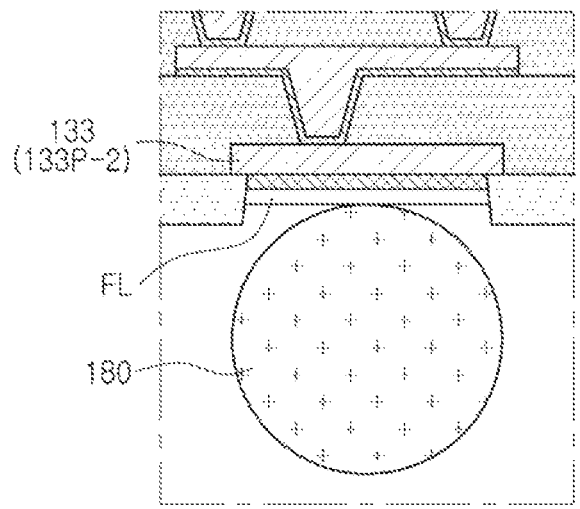
Figure 3B:
Figure 3B:
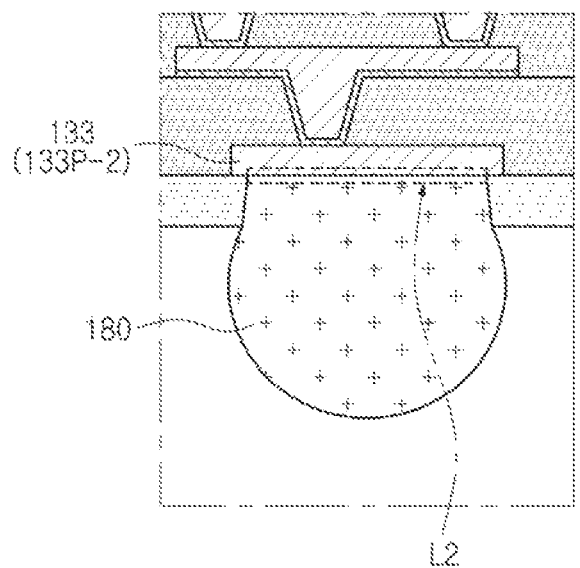

Referring to FIG. 3B, before connecting the connection bumps 180 to the second pad patterns 133P-1, OSP 137o may be cleaned by applying a flux FL on the OSP 137o. Accordingly, a metal bonding layer L2 made of an alloy of copper and tin may be formed at an interface between the second pad patterns 133P-2 and the connection bumps 180. The metal bonding layer L2 made of an alloy of copper and tin has relatively high drop reliability because the metal boding layer is strong against external impact and bending, but has a weakness of having relatively low TC reliability compared to an example of being surface treated with a metal layer.

When the printed circuit board 100 is mounted on the same board as a module substrate through connection bumps 180, pad patterns of the board connected to the connection bumps 180 mostly include copper and are surface-treated with OSP. Accordingly, when the second pad patterns 133P-2 are surface-treated with the OSP 137o, the second pad patterns 133P-2 are surface-treated to be the same as the pad pattern of the board, drop reliability may be further improved.

In the printed circuit board 100 of an example embodiment, second pad patterns 133P-2 disposed in a corner region of the printed circuit board 100 to which a relatively large amount of stress due to impact is applied may be surface-treated with OSP 137o, and first pad patterns 133P-1 disposed in the other regions may be surface-treated with a metal layer 137N, such that TC reliability and drop reliability of the semiconductor package in which the printed circuit board 100 is employed may be simultaneously improved.

Referring to FIG. 1, wiring patterns 133 may be disposed on or in the insulating layers 121, 122, and 123. The wiring patterns 133 may be electrically connected to each other. The wiring patterns 133 may include a barrier layer 131 and a wiring conductive layer 132. The barrier layer 131 may include at least one of titanium (Ti), tantalum (Ta), cobalt (Co), titanium nitride (TiN), and tantalum nitride (TaN). The wiring conductive layer 132 may include a metal material, for example, copper (Cu), aluminum (Al), silver (Ag), tin (Sn), gold (Au), nickel (Ni), lead (Pb), or titanium (Ti), or alloys thereof.

Connection vias 135 may penetrate through the insulating layers 121, 122, and 123, to interconnect the plurality of wiring patterns 133. The connection vias 135 may interconnect the plurality of wiring patterns 133 and the pad patterns 133P. The connection vias 135 may include a barrier layer 131 and a wiring via layer 134. The barrier layer 131 may extend along lower surfaces of the wiring patterns 133 and lower surfaces and side surfaces of the connection vias 135. The wiring via layer 134 may include a metal material, for example copper (Cu), aluminum (Al), silver (Ag), tin (Sn), gold (Au), nickel (Ni), lead (Pb), or titanium (Ti), or alloys thereof. The connection vias 135 may have a filled via in which a metal material is filled or a conformal via in which a metal material is formed along an inner wall of the via hole.

Figure 5:
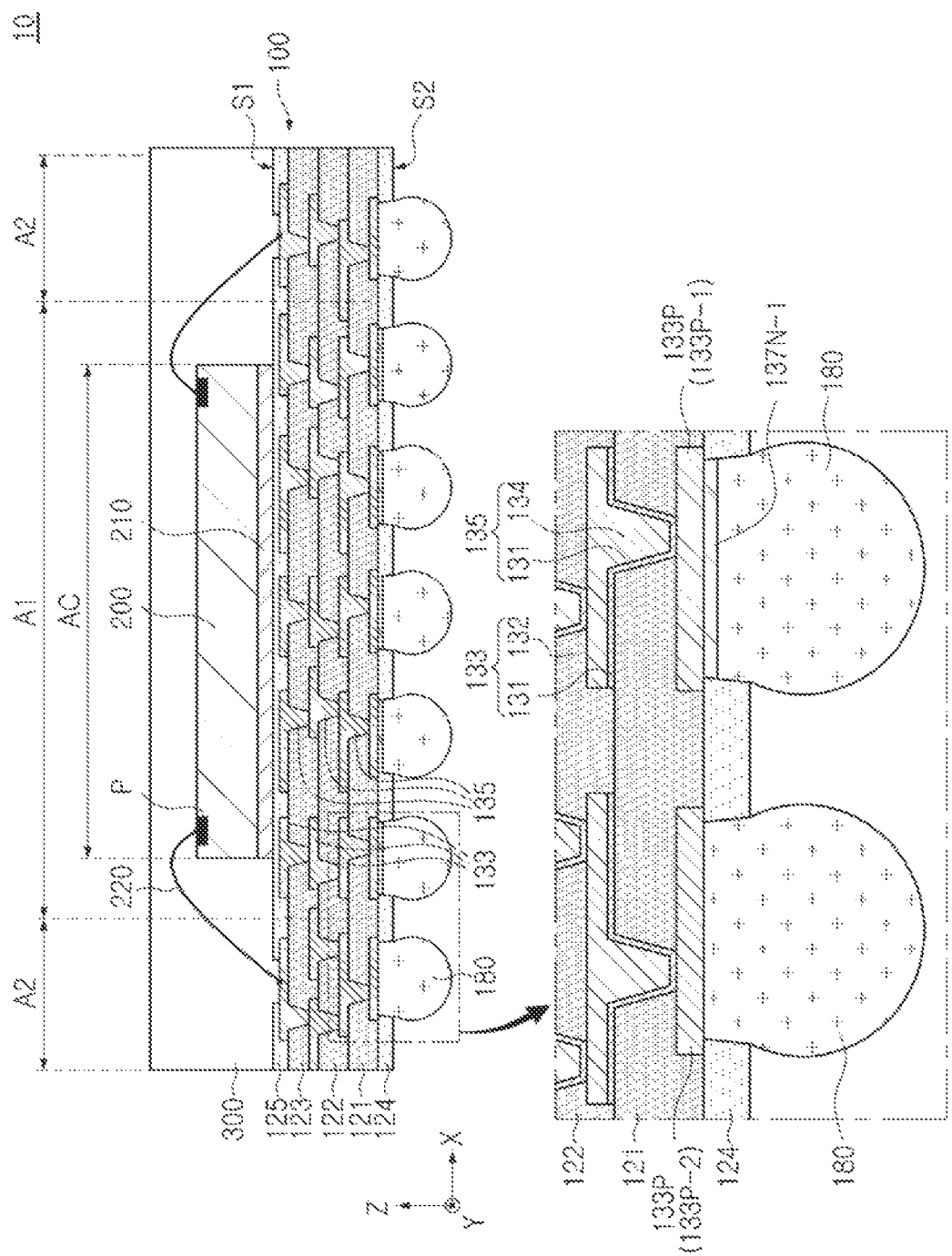
FIG. 5 is a cross-sectional view illustrating a semiconductor package employing the printed circuit board of FIG. 1.

A semiconductor package according 10 to an example embodiment will be described with reference to FIG. 5. FIG. 5 is a cross-sectional view illustrating a semiconductor package 10 employing the printed circuit board 100 of FIG. 1. Since the printed circuit board 100 employed in the semiconductor package 10 according to the example embodiment has the same configuration as the printed circuit board 100 described with reference to FIG. 1 above, a detailed description thereof will be omitted.

The semiconductor chip 200 is disposed on an upper surface of the printed circuit board 100, and may include a connection pad P electrically connected to wiring patterns 133 of the printed circuit board 100. For example, the semiconductor chip 200 may be disposed such that a surface, opposite to the surface on which the connection pad P is disposed, faces the printed circuit board 100. The connection pad P may include, for example, a metal material such as aluminum (Al). In an example embodiment, one or a plurality of semiconductor chips 200 may be stacked. Each of the semiconductor chips 200 may include an adhesive layer 210 disposed on a lower surface thereof, and the adhesive layer 210 may be bonded to the printed circuit board 100. The connection pad P may be disposed on a surface opposite to the surface on which the adhesive layer 210 is disposed in the semiconductor chip 200. In an example embodiment, the semiconductor chip 200 may be mounted on the printed circuit board 100 in a wire bonding method. For example, a bonding wire 220 may be connected to the connection pad P and the wiring patterns 133 to provide an electrical connection path therebetween. According to another example embodiment, the semiconductor chip 200 may be mounted on the printed circuit board 100 by a flip-chip bonding method.

The semiconductor chip 200 may be a logic chip or a memory chip. The logic chip may include, for example, a central processing unit (CPU), a graphics processing unit (GPU), a field programmable gate array (FPGA), a digital signal processor, an encryption processor, a microprocessor, a microcontroller, an analog-digital converter, an application-specific IC (ASIC), or the like. The memory chip may include a volatile memory device such as a dynamic RAM (DRAM), a static RAM (SRAM), and the like or a non-volatile memory device such as a phase change RAM (PRAM), a magnetic RAM (MRAM), a resistive RAM (RRAM), a flash memory, and the like.

The capping layer 300 may be disposed on the printed circuit board 100, and may cover the semiconductor chip 200 and the printed circuit board 100. The capping layer 300 may include an insulating material, for example, a thermosetting resin such as an epoxy resin, a thermoplastic resin such as polyimide, or a prepreg including an inorganic filler and/or glass fiber, Ajinomoto Build-up Film (ABF), FR-4, bismaleimide triazine (BT), an epoxy molding compound (EMC), and the like.

The connection bumps 180 may have a land, ball, or pin shape. The connection bumps 180 may include, for example, tin (Sn), or an alloy (e.g., Sn—Ag—Cu) including tin (Sn). The connection bumps 180 may be disposed under the printed circuit board 100, for example, on the second surface S2 of the printed circuit board 100, and may be electrically connected to the pad patterns 133P. The connection bumps 180 may be electrically connected to the nickel layer 137N-1 disposed under the first pad pattern 133P-1. The connection bumps 180 may be electrically connected to the second pad pattern 133P-2. The connection bumps 180 may physically and/or electrically connect the semiconductor package 10 to a separate board. The connection bumps 180 may include, for example, a lead free solder ball.

As set forth above, a printed circuit board and a semiconductor package with improved electrical characteristics and reliability may be provided by altering a surface treatment of a pad pattern according to a position of the pad pattern.

Various and advantageous advantages and effects of embodiments are not limited to the above description, it will be more readily understood in the process of describing the specific embodiments of the present inventive concept.

While example embodiments have been shown and described above, it will be apparent to those skilled in the art that modifications and variations could be made without departing from the scope of the present inventive concept as defined by the appended claims and their equivalents.

What is claimed is:

1. A printed circuit board comprising:
   a substrate structure having a first surface comprising a chip mounting region on which a semiconductor chip is mounted and a second surface opposite to the first surface, the second surface having a rectangular shape having a first edge, a second edge, a third edge, and a fourth edge and a first corner, a second corner, a third corner, and a fourth corner formed by the first to fourth edges; and
   pad patterns disposed on the second surface of the substrate structure,
   wherein the second surface comprises:
      a first region comprising a region corresponding to the chip mounting region and in contact with the first to fourth edges of the second surface, respectively; and
      second regions adjacent to the first to fourth corners of the second surface, respectively and spaced apart from each other by the first region,
   wherein the pad patterns comprise:
      first pad patterns disposed in the first region and surface-treated with a nickel/gold (Ni/Au) layer; and
      second pad patterns disposed in the second regions and surface-treated with an organic solderability preservative (OSP), and
   wherein a level of at least one lower surface of the first pad patterns that are surface-treated is lower than a level of at least one lower surface of the second pad patterns that are surface-treated.

2. The printed circuit board of claim 1, wherein the substrate structure further comprises a passivation layer disposed on a portion of the pad patterns, the passivation layer having openings forming the pad patterns by exposing a portion of the second surface.

3. The printed circuit board of claim 2, wherein the OSP and the nickel/gold layer are in contact with the openings, respectively.

4. The printed circuit board of claim 3, wherein the nickel/gold layer comprises
a nickel layer in direct contact with the first pad patterns in a direction perpendicular to the second surface; and
a gold layer disposed on the nickel layer.

5. The printed circuit board of claim 2, wherein the pad patterns comprise copper (Cu).

6. The printed circuit board of claim 1, wherein the second pad patterns comprise pad patterns adjacent to the first to fourth corners, respectively.

7. The printed circuit board of claim 6, wherein the second regions comprise a region extending along the first to fourth edges, respectively.

8. The printed circuit board of claim 1, wherein the pad patterns are disposed in a matrix form having a plurality of rows and plurality of columns.

9. A printed circuit board comprising:
a substrate structure having a first surface comprising a chip mounting region on which a semiconductor chip is mounted, and a second surface opposite to the first surface; and
pad patterns disposed on the second surface of the substrate structure,
wherein the second surface comprises:
a first region comprising a region corresponding to the chip mounting region and in contact with respective edges of the second surface; and
second regions adjacent to respective corners of the second surface and spaced apart from each other,
wherein the pad patterns comprise first pad patterns surface-treated with a metal layer and second pad patterns surface-treated with an oxidation prevention layer,
wherein the first pad patterns are disposed in the first region, and the second pad patterns are disposed in the second regions, respectively, and
wherein a level of at least one lower surface of the first pad patterns surface-treated is lower than a level of at least one lower surface of the second pad patterns surface-treated.

10. The printed circuit board of claim 9, wherein the metal layer comprises a nickel/gold (Ni/Au) layer, and
wherein an antioxidant layer comprises an organic solderability preservative.

11. The printed circuit board of claim 9, wherein each of the second regions does not overlap the chip mounting region.

12. The printed circuit board of claim 9, wherein the second regions are disposed rotationally symmetrically every 90° with respect to a center of the second surface.

13. The printed circuit board of claim 9, wherein areas of the second regions are substantially the same.

14. The printed circuit board of claim 9, wherein the second regions comprises a second pad pattern adjacent to any one of the corners among the first pad patterns, respectively.

15. A semiconductor package comprising:
a semiconductor chip;
a substrate structure having a first surface comprising a chip mounting region on which the semiconductor chip is mounted and a second surface, opposite to the first surface, the second surface having a rectangular shape having a first edge, a second edge, a third edge, and a fourth edge, and a first corner, a second corner, a third corner, and a fourth corner formed by the first to fourth edges;
pad patterns disposed on the second surface of the substrate structure; and
connection bumps respectively connected to the pad patterns,
wherein the pad patterns comprise:
first pad patterns disposed in a first region respectively adjacent to the first to fourth edges and comprising a region corresponding to the chip mounting region, in direct contact with the connection bumps, and the first pad patterns comprising a first metal material and having a metal layer comprising a second metal material disposed on an interface in contact with the connection bumps; and
second pad patterns disposed in second regions respectively adjacent to the first to fourth corners, the second regions being regions other than the first region, the second pad patterns comprising the first metal material, and
wherein a level of at least one lower surface of the first pad patterns is lower than a level of at least one lower surface of the second pad patterns.

16. The semiconductor package of claim 15, wherein the first metal material includes copper (Cu),
wherein the second metal material includes nickel (Ni), and
wherein the connection bumps include tin (Sn).

17. The semiconductor package of claim 15, wherein in a direction perpendicular to the second surface, each of the first pad patterns has a first thickness between an upper surface and a lower surface of each of the first pad patterns,
wherein the metal layer has a second thickness between an upper surface and a lower surface,
wherein in the perpendicular direction, each of the second pad patterns has a third thickness between an upper surface and a lower surface of each of the second pad patterns,
and
wherein a sum of the first thickness and the second thickness is greater than the third thickness.

18. The semiconductor package of claim 15, wherein the substrate structure further comprises a passivation layer disposed on a portion of the pad patterns, and having openings forming the pad patterns by exposing a portion of the second surface, and
wherein the connection bumps are in contact with side surfaces of the openings, respectively, and are connected to the pad patterns.

19. The semiconductor package of claim 18, further comprising a capping layer disposed on the semiconductor chip and the first surface of the substrate structure.

20. The semiconductor package of claim 18, wherein the connection bumps are lead free solder balls.

* * * * *